455-602 AU 233 EX
FIP8106 OR 3,751,671

United States Patent [19] [11] 3,751,671
Maniere et al. [45] Aug. 7, 1973

[54] OPTO-ELECTRONIC RELAY

[75] Inventors: Maurice A. Maniere, Conflans-Sainte-Honorine; Pierre Thepaut, Paris, both of France

[73] Assignee: Lignes Telegraphiques et Telephoniques, Paris, France

[22] Filed: July 25, 1972

[21] Appl. No.: 275,061

[30] Foreign Application Priority Data
July 27, 1971 France .............................. 7127503

[52] U.S. Cl. .............................................. 250/199
[51] Int. Cl. ............................................ H04b 9/00
[58] Field of Search .................... 325/150; 250/199; 317/33, 43; 307/311, 312, 117; 331/94.5; 330/4.3, 4.5

[56] References Cited
UNITED STATES PATENTS
3,371,232 2/1968 Hannan et al. .................... 250/199
3,483,529 12/1969 Fenner.............................. 331/94.5

*Primary Examiner*—Albert J. Mayer
*Attorney*—Otto John Munz

[57] ABSTRACT

An opto-electronic relay comprising an electroluminescent diode fed from unipolar or bipolar telegraph signals and a phototransistor converting the light radiated by the electroluminescent diode into relayed electric signals. Protection means are provided against overload of said diode by too strong input signals. Distortion correction means are also provided for improving the waveform of the relayed signals. The protection means include the series connection of a resistor with said diode and at least one silicon diode and a transistor shunting said diodes, while the distortion correction means include a series R.C. circuit shunting said electroluminescent and protection diodes.

2 Claims, 6 Drawing Figures

OPTO-ELECTRONIC RELAY

The present invention relates to solid state opto-electronic relay devices particularly suited for use in telegraph communication circuits.

Relay devices of this type are already known in the art and generally comprise an electroluminescent semiconductor diode coupled to the input terminals of the relay device through protection means and a photovoltaic solar type cell or a phototransistor spaced from said diode to receive optical radiation therefrom and a semiconductor switch switchable between conducting and nonconducting states in response to radiation impinging upon the photovoltaic cell or the phototransistor.

Electroluminescent diodes have a low back resistance and are subject to being burned out when drawing excessive reverse current. For this reason, telegraph signals are applied thereto through a protection circuit which conventionally comprises a low voltage silicon diode serially connected to the electroluminescent diode and a resistor of several kilohms and a high voltage silicon diode respectively shunting the electroluminescent diode on both sides of the low voltage silicon diode. The high voltage diode conducts the reverse current but, since it has some forward resistance, the series low voltage diode and shunt resistor provide additional protection.

It is one object of the present invention to improve the protection of the electroluminescent diode of opto-electronic relays.

Another object of the present invention is to design the protection circuit of the electroluminescent diode of an opto-electronic relay so as it serves as a circuit to correct distortion.

The protection and anti-distortion circuit incorporated in the opto-electronic relay and feeding the electroluminescent diode thereof comprises a protection diode shunting the electroluminescent diode and having its forward direction opposite that of the electroluminescent diode, at least a resistor serially connected with both said electroluminescent and protection diodes and a transistor shunting said diodes and having its emitter and base respectively connected to the two ends of said resistor.

For correcting the distortion of the telegraph signals a serially connected capacitor and resistor circuit is inserted in shunt with the electroluminescent and protection diodes, and the capacitor is first charged during the leading edge of the telegraph signal, then discharged through the luminescent diode during the trailing edge of said signal, thereby increasing the duration of the current flowing through the same and finally discharged through the transistor when, the feeding current having its direction inverted, the transistor is brought to conduction by the voltage drop across the serial resistor, thereby steepening the waveform of the current through the luminescent diode.

These and further objects and advantages of the invention will be more apparent upon reference to the following specification, claims and appended drawings wherein :

Figure 1:
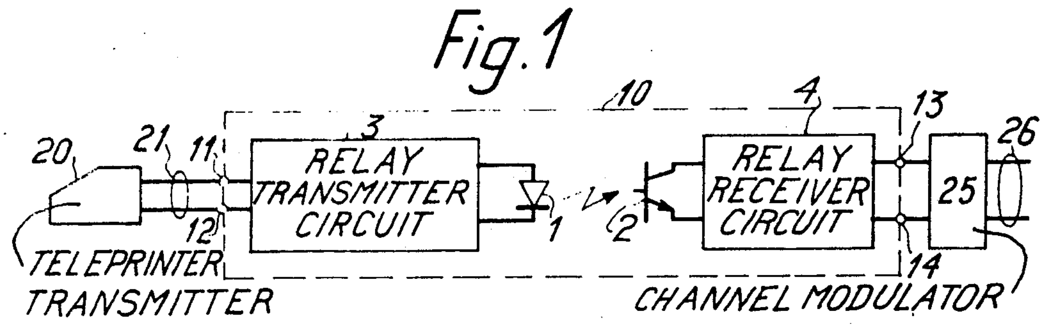
FIG. 1 is a circuit diagram of the opto-electronic relay of the present invention as incorporated in a teleprinter circuit, the electroluminescent diode protection and anti-distortion circuit and the phototransistor amplifier circuit being represented in block diagram form.

Referring now to the drawings and especially to FIG. 1, a conventional opto-electronic relay is generally indicated by its enclosure in the dashed box 10 and includes a pair of input terminals 11 and 12 and a pair of output terminals 13 and 14. Input terminals 11–12 are indicated as coupled to a suitable teleprinter transmitter 20 by way of a transmission line 21. Output terminals 13–14 are coupled to a channel modulator 25 which is connected to a teleprinter receiver (not shown) through a transmission line 26.

Transmission line 21 forms a conventional D.C. teleprinter loop operating with a current of substantially 20 milliamperes in the neutral or single current operation mode or in the po/ar or double current operation mode.

Figure 6:
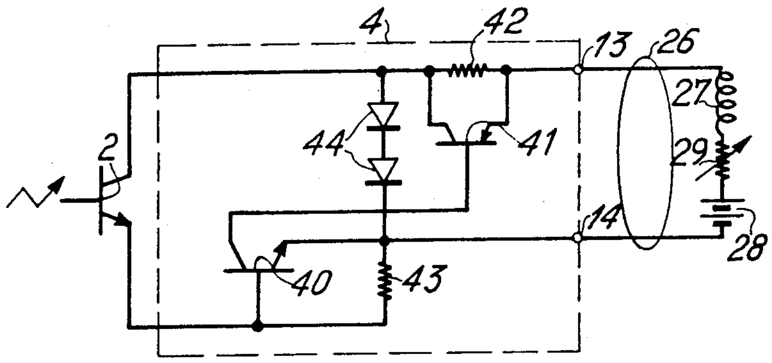
FIG. 6 is a circuit diagram of a D.C. amplifier of the phototransistor current provided with threshold voltage generating means.

Instead of being inserted between a teleprinter transmitter and a channel modulator, the relay can similarly be inserted between a channel demodulator and a teleprinter receiver (27 in FIG. 6).

Telegraph communication line 21 exhibits a distributed capacitance proportional to its length. Hence it follows that the signals produced by the teleprinter transmitter 20 are distorted in the course of propagation. The rectangular signal generated by transmitter 20 and having a duration T is represented at A on line a of FIG. 2 and when it is present at input terminals 11–12 of the opto-electronic relay, it has the waveform shown at B on line b of FIG. 2, where the telegraph current $I_e$ is plotted versus time. The maximal value of the current $I_e$ is assumed to be 20 mA.

Figure 2:
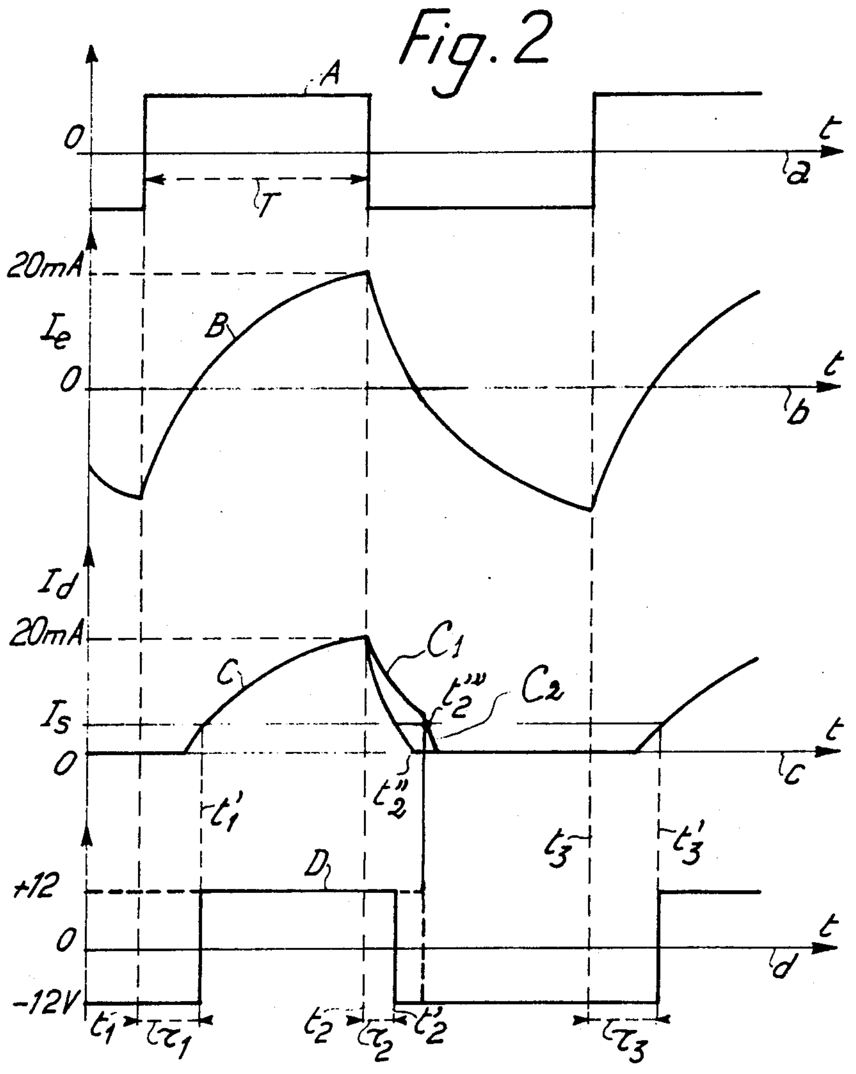
FIG. 2 represents signal waveform at various points of the protection and anti-distortion circuit for explanation of the operation thereof.

Current $I_d$ flowing through the electroluminescent diode is equal to $I_e$ when $I_e$ is positive and to zero when $I_e$ is negative. It is represented at C on line *c* of FIG. 2. The horizontal line of ordinate $I_s$ represents the switching threshold. Switching takes place at instants $t_1'$, $t_2'$, $t_3'$, . . . when $I_d$ is equal to $I_s$; thus it appears that switching occurs with delays $\tau_1, \tau_2, \tau_3, \ldots$ with respect to the corresponding transition times $t_1, t_2, t_3, \ldots$ of the transmitted signals. The output signal shown at D on line *d* of FIG. 2, is affected with distortion. The value of the distortion is $(\tau_2 - \tau_1)/T$; it is all the higher as the telegraph communication line is the longer.

The electroluminescent diode protection and anti-distortion circuit includes means for correcting the distortion.

Figure 3:
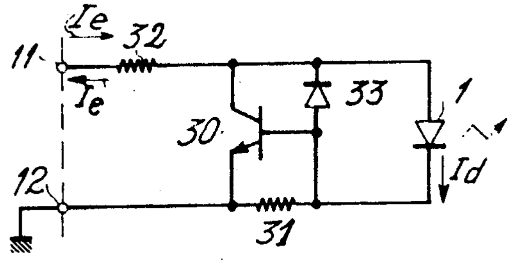
FIG. 3 represents the electroluminescent diode protection circuit.

Referring to FIG. 3, the protection circuit 3 of the electroluminescent diode 1 includes a transistor 30 and a diode 33 in shunt with the diode 1, the current conducting directions of the two diodes being opposite with respect to each other. Two resistors 31 and 32 are inserted in the feeding line. The collector of transistor 30 is connected to one wire of the line and its base and emitter are connected to the other wire respectively at the two ends of resistor 31.

Circuit 3 operates as follows : Current $I_e$ flows through electroluminescent diode 1 or protection diode 33 according to its direction. Diode 1 is then protected against reverse voltage. Transistor 30 is nonconducting if the feeding current has its normal value, say 20 milliamperes. If the feeding current takes a higher value, say 40 milliamperes, transistor 30 becomes conducting due to the voltage drop across resistor 31. Then the current flows through transistor 30 and the electroluminescent diode is protected against heavy currents.

Figure 4:
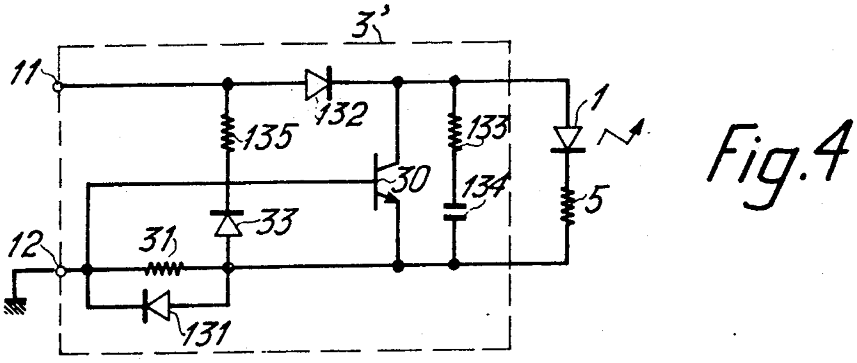
FIGS. 4 and 5 are circuit diagrams of the electroluminescent diode protection and anti-distortion circuit.

Referring now to FIG. 4, circuit 3' comprises a transistor 30 having an emitter connected to terminal 12 through a resistor 31 shunted by a diode 131, and a collector connected to terminal 11 through a diode 132. A series RC circuit formed by resistor 133 and capacitor 134 is connected at its two ends to the emitter and collector of transistor 30. The electroluminescent diode together with a high value serial resistor 5 is also connected between the emitter and collector of transistor 30. The base of this transistor is directly connected to terminal 12. Finally a series circuit formed of resistor 135 and diode 33 is connected at one end to terminal 11 and at the other end to the emitter of transistor 30.

During the ascending portion of curve C, current flows along the path : terminal 11, diode 132, electroluminescent diode 1, resistor 5, diode 131, terminal 12. Capacitor 134 charges through resistor 133. During the descending portion of curve C, capacitor 134 discharges into electroluminescent diode 1 and resistor 5, thus generating an additional current in electroluminescent diode 1, shown at $C_1$ on line $c$ of FIG. 2. The capacitance of capacitor 134 and the resistances of resistors 5 and 133 are so selected that the current $I_d$ thus increased be still larger than the threshold current $I_t$ at time $t_2''$ when $I_e$ becomes equal to zero. After $t_2''$, the current $I_e$ reverses and follows the new path : terminal 12, resistor 31, diode 33, resistor 135, terminal 11. A potential difference is built up across resistor 31 and transistor 30 turns to its conducting condition; the turn over time is determined to occur just before the time at which current $I_d$ increased by the discharge current would reach the value $I_t$. Then capacitor 134 quickly discharges into resistor 133 and transistor 30 (resistance 133 is quite smaller than resistance 5) and the current across electroluminescent diode suddenly falls to zero (curve $C_2$ on line $c$ of FIG. 2). It results that the end of signal D takes place at time $t_2'''$ (see FIG. 2) instead of time $t_2'$ and the distortion level is improved.

Figure 5:
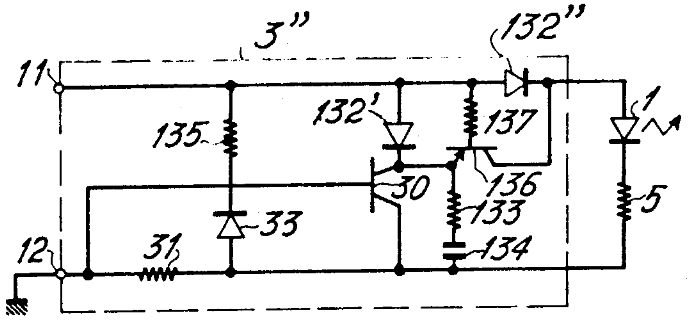

The protection and anti-distortion circuit 3'' of FIG. 5 comprises, like that of FIG. 4, a transistor 30 in series with a diode 132', this serial circuit being connected between terminals 11 and 12. Resistor 31 is no longer shunted by a diode. The serial circuit formed of resistor 133 and capacitor 134 is connected at one end to the emitter of transistor 30 and at the other end to the collector of transistor 30 and the emitter of another transistor 136 of a conductivity type opposite that of transistor 30. The base of transistor 136 is connected to terminal 11 through resistor 137 and a diode 132'' is inserted between the base and the collector of transistor 136.

There are two possible discharge circuits for capacitor 134, the first including transistor 136, electroluminescent diode 1, resistor 5 and resistor 133, the second including resistor 133 and transistor 30. During the ascending portion of current $I_e$, capacitor 134 charges through diode 132' (diode 132' plays the same part as diode 132), resistor 133 and resistor 31. During the descending portion of current $I_e$, the first discharge is carried out through transistor 136, electroluminescent diode 1 and resistors 5 and 133. Then, at the reversal of current $I_e$, transistor 30 is unblocked by the voltage drop across resistor 31 and the final discharge takes place through resistor 133 and transistor 30.

FIG. 6 shows an embodiment of an opto-electronic relay reception circuit, operating in the single current mode.

In FIG. 6, a teleprinter receiver 27 indicated in the drawing by showing the coil for the printer magnet and coupled in series with a suitable 48 volts power supply illustrated by the battery 28 and a loop current regulator indicated in the drawing by a variable resistor 29 is connected to the output terminals 13–14 of D.C. amplifier 4.

Amplifier 4 comprises two transistors 40 and 41 of respectively NPN and PNP type. The base of transistor 40 is D.C. coupled to the emitter of phototransistor 2 and the base of transistor 41 is D.C. coupled to the collector of transistor 40. Terminals 13 and 14 are respectively connected to the emitter of transistors 40 and 41. Emitter resistor 43 has a value of 20 kilohms and resistor 42 connected between the emitter and collector of transistor 41, a value of 1 Megohm.

The operation of amplifier 4 is the following :

When the current in electroluminescent diode 1 is zero, phototransistor 2 is blocked together with transistors 40 and 41. A quite small current, say 50 microamperes flows through the path : terminal 13, resistor 42, diodes 44, terminal 14. This current is too small to activate coil 29. When the current in electroluminescent diode 1 has its standard value, phototransistor 2 becomes conducting together with transistor 40 and 41. Resistor 42 is shortcircuited and the current flows through the path : terminal 13, transistor 41, diodes 44, terminal 14.

What we claim is :

1. A opto-electronic relay comprising an electroluminescent diode, means for applying to said electroluminescent diode pulses representing information data, a protection diode shunting said electroluminescent diode and having its forward direction opposite that of the electroluminescent diode, at least a resistor serially connected with both said electroluminescent and protection diodes, a transistor shunting said diodes and having its emitter and base respectively connected to the two ends of said resistor, a phototransistor spaced from said electroluminescent diode to receive optical radiation therefrom and a direct current amplifier connected to said phototransistor.

2. An opto-electronic relay comprising an electroluminescent diode, means for applying to said electroluminescent diode pulses representing information data, a protection diode shunting said electroluminescent diode and having its forward direction opposite that of the electroluminescent diode, at least a resistor serially connected with both said electroluminescent and protection diodes, a first transistor shunting said diodes and having its emitter and base respectively connected to the two ends of said resistor, a second transistor of conductivity type opposite that of the first transistor, a series circuit including a resistor, a capacitor and said second transistor shunting said electroluminescent and protection diodes and said first transistor, a phototransistor spaced from said electroluminescent diode to receive optical radiation therefrom and a direct current amplifier connected to said phototransistor.

* * * * *